(12) United States Patent
Kim

(10) Patent No.: US 10,256,436 B2
(45) Date of Patent: Apr. 9, 2019

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-Do (KR)

(72) Inventor: Kwang Nyun Kim, Osan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/456,357

(22) Filed: Aug. 11, 2014

(65) Prior Publication Data

US 2015/0303406 A1    Oct. 22, 2015

(30) Foreign Application Priority Data

Apr. 22, 2014  (KR) .................... 10-2014-0048075

(51) Int. Cl.
   *H01L 51/52*   (2006.01)

(52) U.S. Cl.
   CPC ...... *H01L 51/5256* (2013.01); *H01L 51/5253* (2013.01); *H01L 2227/323* (2013.01)

(58) Field of Classification Search
   CPC ..................... H01L 51/50; H01L 51/5237
   See application file for complete search history.

(56) References Cited

U.S. PATENT DOCUMENTS

| | | | | |
|---|---|---|---|---|
| 2005/0140030 A1* | 6/2005 | Howard | .............. | H01L 21/6836 257/797 |
| 2005/0212419 A1* | 9/2005 | Vazan | ................. | H01L 51/5237 313/512 |
| 2011/0139747 A1* | 6/2011 | Lee | ..................... | H01L 51/0096 216/37 |
| 2011/0163332 A1* | 7/2011 | Ma | ...................... | H01L 51/5237 257/88 |
| 2013/0092972 A1* | 4/2013 | Kim | .................... | H01L 51/5256 257/100 |
| 2014/0191203 A1* | 7/2014 | Son | ..................... | H01L 51/5284 257/40 |
| 2014/0319474 A1* | 10/2014 | Kim | .................... | H01L 51/5256 257/40 |

FOREIGN PATENT DOCUMENTS

| | | |
|---|---|---|
| KR | 10-2007-0051088 A | 5/2007 |
| KR | 10-0870666 B1 | 11/2008 |
| KR | 10-2010-0064602 A | 6/2010 |
| KR | 10-2013-0022649 A | 3/2013 |

* cited by examiner

*Primary Examiner* — Thao X Le
*Assistant Examiner* — Geoffrey H Ida
(74) *Attorney, Agent, or Firm* — F. Chau & Associates, LLC

(57) ABSTRACT

An organic light-emitting diode (OLED) display and a method of manufacturing the same are disclosed. The OLED display comprises a substrate on which are defined a display area and a non-display area, an inorganic layer formed over the substrate, an encapsulation layer formed over the inorganic layer. A portion of the inorganic layer is formed over the non-display area, a portion of the encapsulation layer is formed over the non-display area, and a plurality of openings are formed in the portion of the encapsulation layer and the portion of the inorganic layer.

17 Claims, 12 Drawing Sheets

【Fig.1】
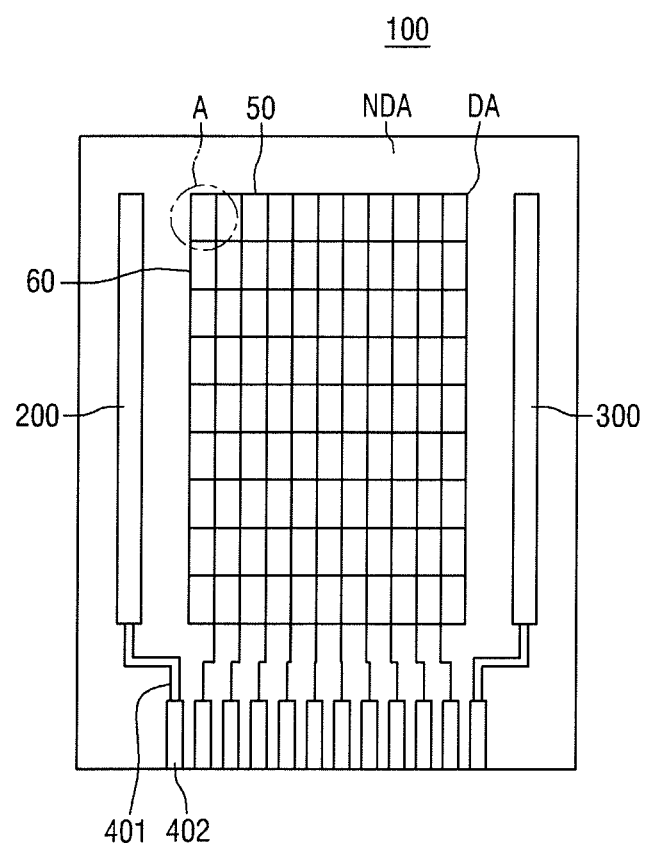

[Fig.2]
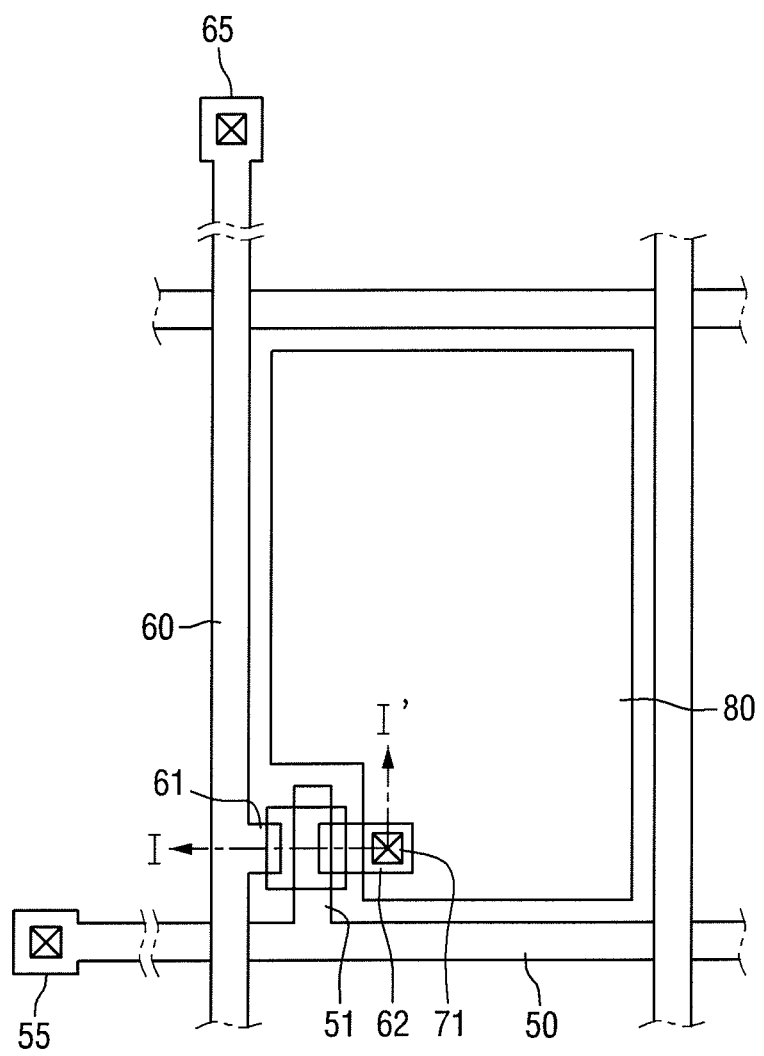

[Fig.3]
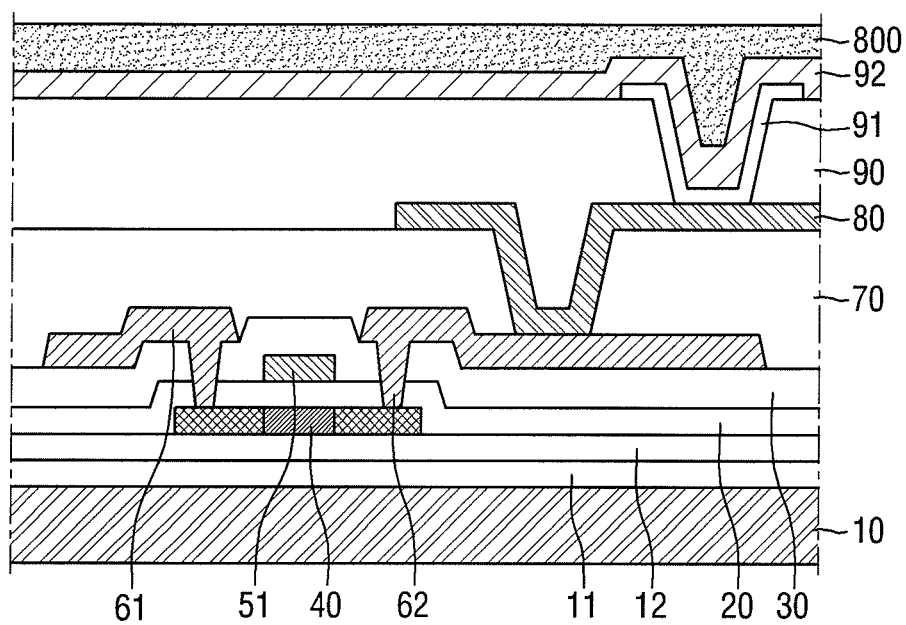

[Fig.4]
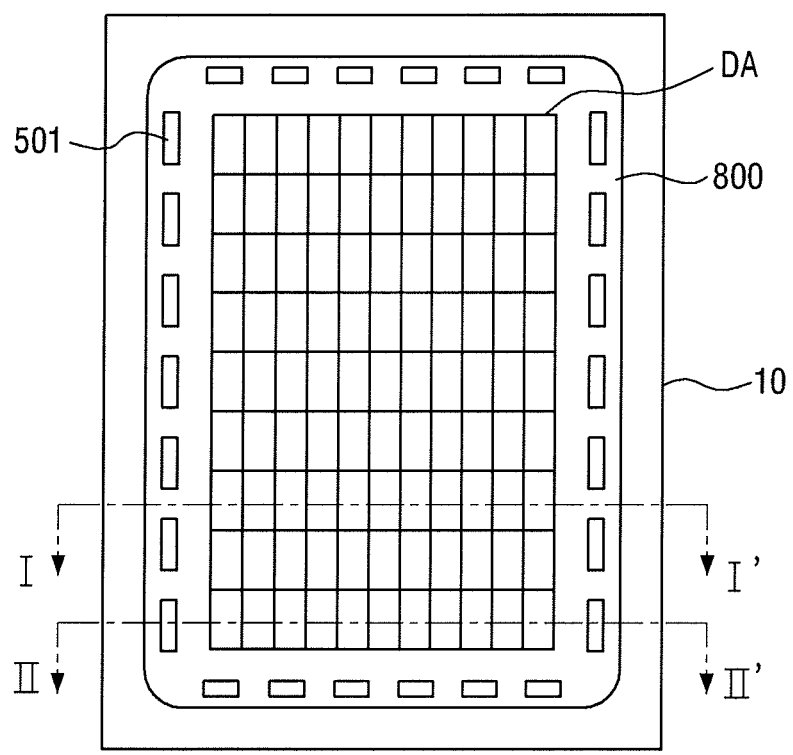

[Fig.5]
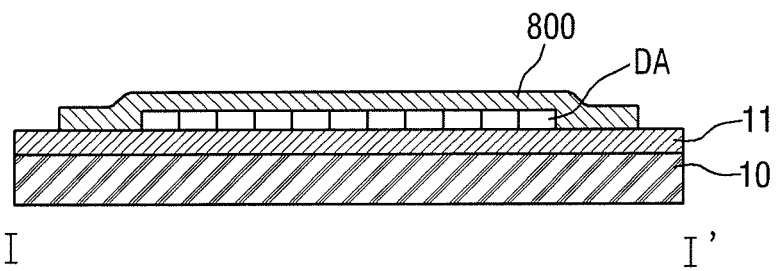

[Fig.6]
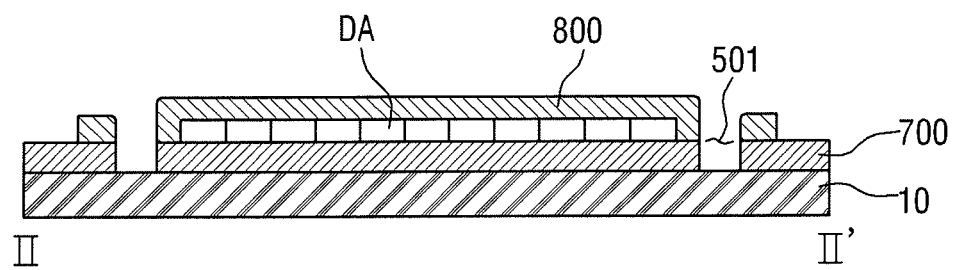

[Fig.7]
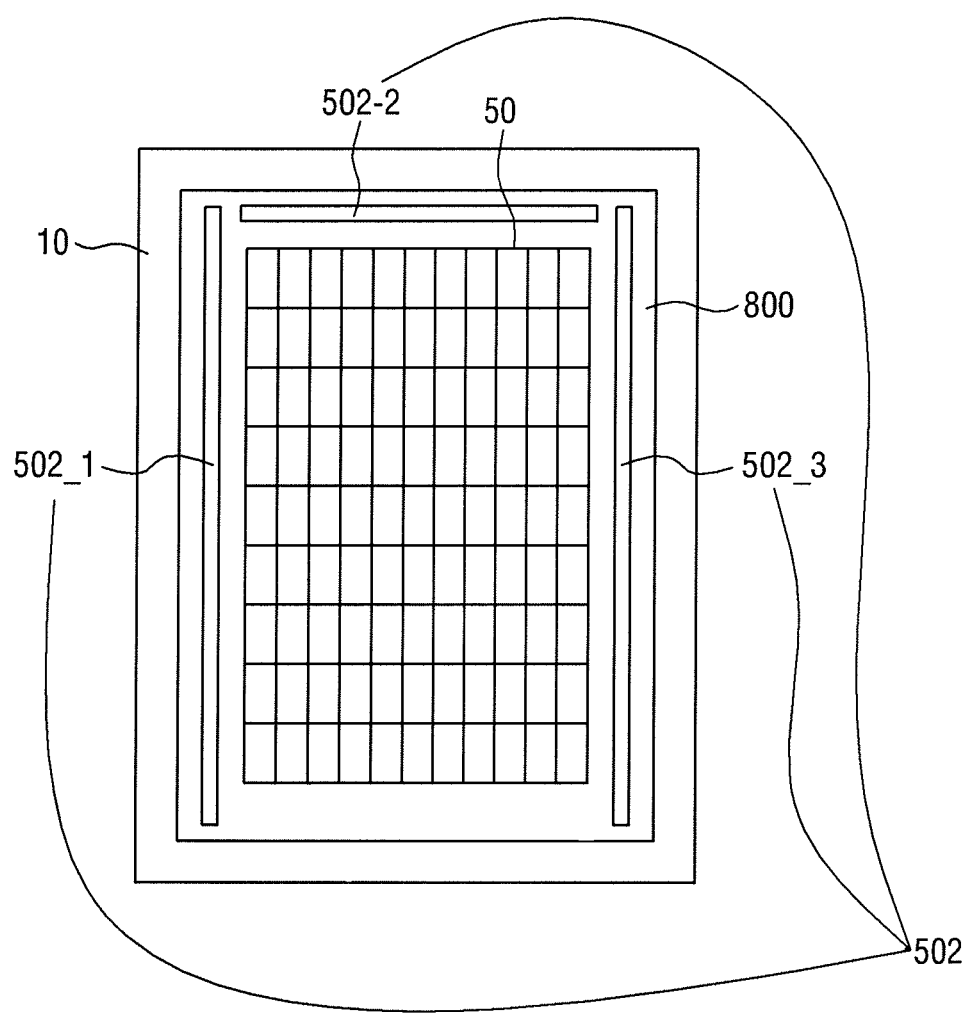

[Fig.8]
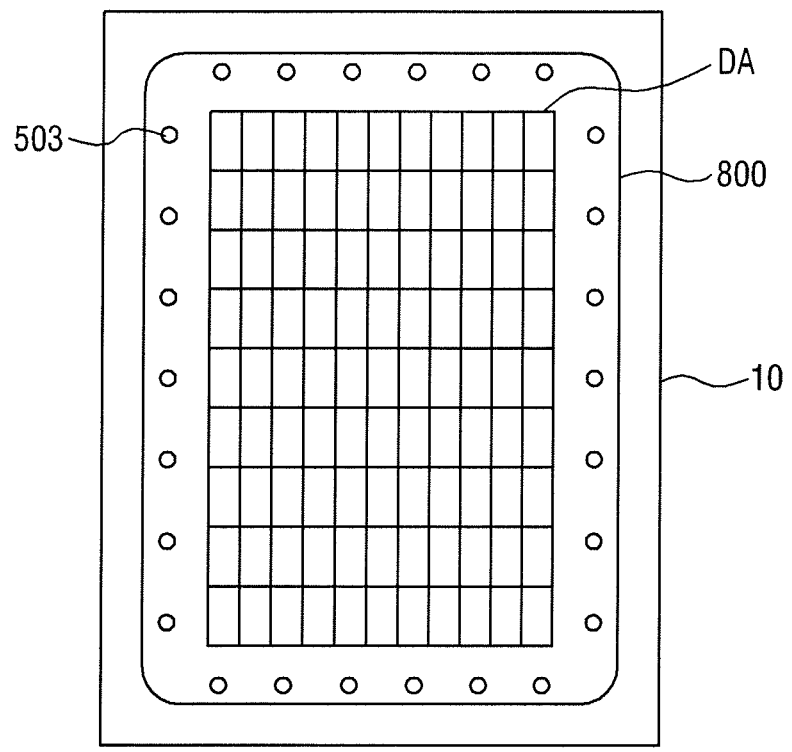

[Fig.9]
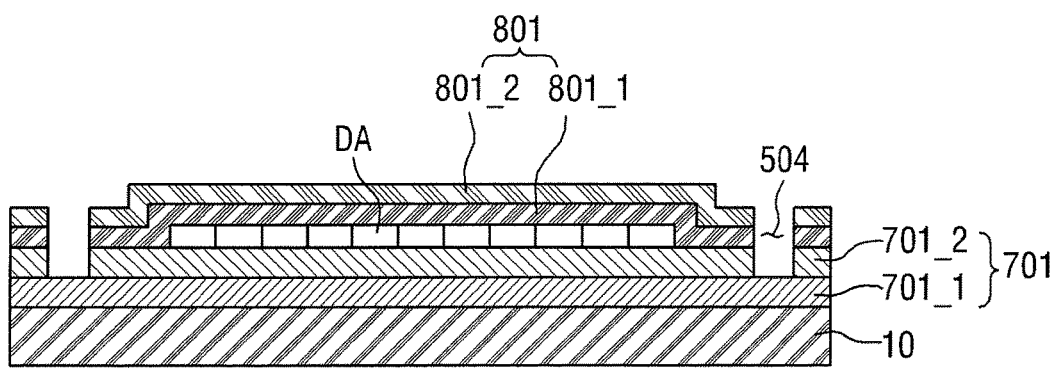

[Fig.10]
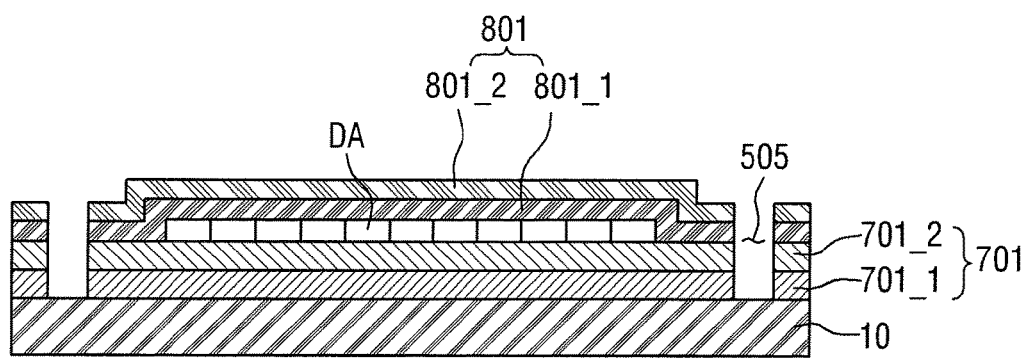

【Fig.11】
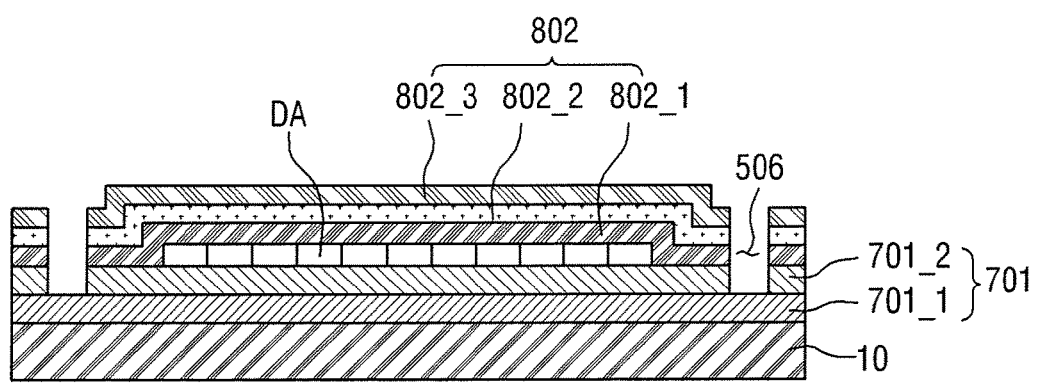

[Fig.12]
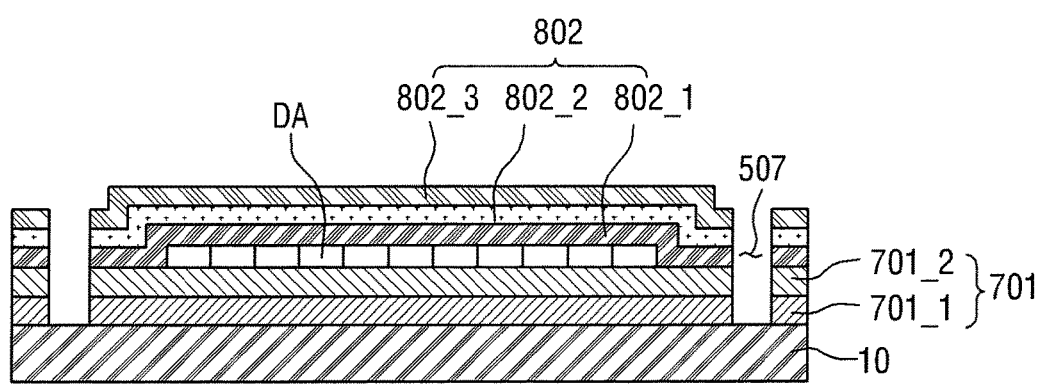

US 10,256,436 B2

ORGANIC LIGHT-EMITTING DIODE (OLED) DISPLAY AND METHOD OF MANUFACTURING THE SAME

INCORPORATION BY REFERENCE TO ANY PRIORITY APPLICATIONS

This application claims priority from Korean Patent Application No. 10-2014-0048075 filed on Apr. 22, 2014 in the Korean Intellectual Property Office, the disclosure of which is incorporated herein by reference in its entirety.

BACKGROUND

Field

The described technology generally relates to an organic light-emitting diode (OLED) display and a method of manufacturing the same.

Description of the Related Technology

Displays such as OLED displays include a substrate in which a display area and a non-display area located outside the display area are defined. The display includes a plurality of pixels in the display area as basic elements for displaying an image, and each of the pixels includes a switching device so as to be driven independently.

The substrate can be a circuit board used to drive each pixel independently in, e.g., an OLED. Gate wirings for delivering scan signals, data wirings for delivering image signals, thin-film transistors (TFTs), and various organic or inorganic layers are formed on the substrate. In particular, each of the TFTs includes a gate electrode which is a portion of a gate wiring, a semiconductor layer which forms a channel, a source electrode which is a portion of a data wiring, and a drain electrode. Accordingly, each of the TFTs serves as a switching device.

In the non-display area, a plurality of wirings connected to gate lines or data lines of the display area are formed. The wirings can extend in various shapes and can have respective ends connected to pads included in a pad unit in a lower part of the substrate.

SUMMARY OF CERTAIN INVENTIVE ASPECTS

One inventive aspect is an organic light-emitting diode (OLED) display structured to prevent the formation of cracks.

Another aspect is an OLED structured to suppress the propagation of cracks formed.

Another aspect is an OLED display comprising a display area and a non-display area, wherein the non-display area comprises a substrate. The OLED display further comprises an inorganic layer formed on the substrate, an encapsulation layer formed on the inorganic layer and a recess pattern recessed from a top surface of the encapsulation layer by a predetermined distance and penetrating through the whole of the encapsulation layer and at least part of the inorganic layer.

In the above OLED display, the display area comprises a first electrode, an organic layer formed on the first electrode and a second electrode formed on the organic layer, wherein the encapsulation layer covers the whole of the display area and at least part of the non-display area.

In the above OLED display, the recess pattern is provided in a plurality, and the recess patterns are adjacent to edges of the display area and arranged along the edges of the display area.

In the above OLED display, the recess pattern penetrates through the inorganic layer to expose a top surface of the substrate.

In the above OLED display, the recess pattern is a line-type recess pattern extending along a lengthwise direction and shaped like a bar.

In the above OLED display, the recess pattern is a dot-type recess pattern having a circular planar shape.

In the above OLED display, the encapsulation layer comprises a first sub-encapsulation layer formed on the inorganic layer and a second sub-encapsulation layer formed on the first sub-encapsulation layer, wherein the first sub-encapsulation layer and the second sub-encapsulation layer are formed of different materials.

In the above OLED display, the inorganic layer comprises a first sub-inorganic layer formed on the substrate and a second sub-inorganic layer formed on the first sub-inorganic layer, wherein the first sub-inorganic layer and the second sub-inorganic layer are formed of different materials.

In the above OLED display, the recess pattern penetrates through the first sub-encapsulation layer, the second sub-encapsulation layer, and the second sub-inorganic layer to expose the first sub-inorganic layer.

In the above OLED display, the recess pattern penetrates through the first sub-encapsulation layer, the second sub-encapsulation layer, the first sub-inorganic layer, and the second sub-inorganic layer to expose the substrate.

The OLED display further comprises an organic encapsulation layer interposed between the first sub-encapsulation layer and the second sub-encapsulation layer.

In the above OLED display, the recess pattern penetrates through the first sub-encapsulation layer, the organic encapsulation layer, the second sub-encapsulation layer, and the second sub-inorganic layer to expose the first sub-inorganic layer.

In the above OLED display, the recess pattern penetrates through the first sub-encapsulation layer, the organic encapsulation layer, the second sub-encapsulation layer, the second sub-inorganic layer, and the first sub-inorganic layer to expose the substrate.

Another aspect is a method of manufacturing an OLED, the method comprising preparing a substrate in which a display area and a non-display area are defined and an inorganic layer is formed, forming an encapsulation layer on the substrate to cover the whole of the display area and at least part of the non-display area, and forming a recess pattern to penetrate through the whole of the encapsulation layer and at least part of the inorganic layer by recessing an area where the encapsulation layer and the inorganic layer overlap each other.

In the above method, the encapsulation layer comprises a first sub-encapsulation layer formed on the inorganic layer, and a second sub-encapsulation layer formed on the first sub-encapsulation layer, wherein the first sub-encapsulation layer and the second sub-encapsulation layer are formed of different materials.

In the above method, the inorganic layer comprises a first sub-inorganic layer formed on the substrate, and a second sub-inorganic layer formed on the first sub-inorganic layer, wherein the first sub-inorganic layer and the second sub-inorganic layer are formed of different materials.

In the above method, the recess pattern penetrates through the first sub-encapsulation layer, the second sub-encapsulation layer, and the second sub-inorganic layer to expose the first sub-inorganic layer.

In the above method, the recess pattern penetrates through the first sub-encapsulation layer, the second sub-encapsulation layer, the first sub-inorganic layer, and the second sub-inorganic layer to expose the substrate.

The above method further comprises forming an organic encapsulation layer between the first sub-encapsulation layer and the second sub-encapsulation layer.

In the above method, the recess pattern penetrates through the first sub-encapsulation layer, the organic encapsulation layer, the second sub-encapsulation layer, and the second sub-inorganic layer to expose the first sub-inorganic layer.

Another aspect is an organic light-emitting diode (OLED) display, comprising: a substrate on which are defined a display area and a non-display area, an inorganic layer formed over the substrate, wherein a portion of the inorganic layer is formed over the non-display area, and an encapsulation layer formed over the inorganic layer, wherein a portion of the encapsulation layer is formed over the non-display area, and wherein a plurality of openings are formed in the portion of the encapsulation layer and the portion of the inorganic layer.

The above OLED display further comprises a first electrode formed over the display area, an organic layer formed over the first electrode, and a second electrode formed over the organic layer, wherein the encapsulation layer is further formed over the display area.

In the above OLED display, the openings are formed adjacent to edges of the display area and arranged along the edges of the display area.

In the above OLED display, the openings are further formed through the inorganic layer so as to expose a portion of the top surface of the substrate.

In the above OLED display, each of the openings is substantially rectangular.

In the above OLED display, each of the openings is substantially circular.

In the above OLED display, the encapsulation layer comprises a first sub-encapsulation layer formed over the inorganic layer, and a second sub-encapsulation layer formed over the first sub-encapsulation layer, wherein the first and second sub-encapsulation layers are formed of different materials.

In the above OLED display, the inorganic layer comprises a first sub-inorganic layer formed over the substrate, and a second sub-inorganic layer formed over the first sub-inorganic layer, wherein the first and second sub-inorganic layers are formed of different materials.

In the above OLED display, the openings are further formed through the first sub-encapsulation layer, the second sub-encapsulation layer, and the second sub-inorganic layer so as to expose a portion of the first sub-inorganic layer.

In the above OLED display, the openings are further formed through the first and second sub-encapsulation layers and the first and second sub-inorganic layers so as to expose the substrate.

The above OLED further comprises an organic encapsulation layer interposed between the first and second sub-encapsulation layers. In the above OLED display, the openings are further formed through the first sub-encapsulation layer, the organic encapsulation layer, the second sub-encapsulation layer, and the second sub-inorganic layer so as to expose a portion of the first sub-inorganic layer.

In the above OLED display, the openings are further formed through the first and second sub-encapsulation layers, the organic encapsulation layer, and the first and second sub-inorganic layers so as to expose the substrate.

Another aspect is a method of manufacturing an organic light-emitting diode (OLED) display, the method comprising forming a display area and a non-display area in and over a substrate, forming an inorganic layer over the substrate, forming an encapsulation layer on the substrate so as to cover the entire display area and at least part of the non-display area, and forming a plurality of openings in an area where the encapsulation layer and the inorganic layer overlap each other so as to penetrate through the encapsulation layer and at least part of the inorganic layer.

In the above method, the encapsulation layer comprises a first sub-encapsulation layer formed over the inorganic layer, and a second sub-encapsulation layer formed over the first sub-encapsulation layer, wherein the first and second sub-encapsulation layers are formed of different materials.

In the above method, the inorganic layer comprises a first sub-inorganic layer formed over the substrate, and a second sub-inorganic layer formed over the first sub-inorganic layer, wherein the first and second sub-inorganic layers are formed of different materials.

In the above method, the openings penetrate through the first and second sub-encapsulation layers so as to expose a portion of the first sub-inorganic layer.

In the above method, the openings penetrate through the first and second sub-encapsulation layers and the first and second sub-inorganic layers so as to expose a portion of the substrate.

The above method further comprises forming an organic encapsulation layer between the first and second sub-encapsulation layers.

In the above method, the openings penetrate through the first and second sub-encapsulation layers, the organic encapsulation layer, and the second sub-inorganic layer so as to expose at least a portion of the first sub-inorganic layer.

BRIEF DESCRIPTION OF THE DRAWINGS

FIG. 1 is a plan view of an organic light-emitting diode display (OLED) according to an embodiment.

FIG. 2 is an enlarged view of a portion "A" of FIG. 1.

FIG. 3 is a cross-sectional view taken along the line I-I' of FIG. 2.

FIG. 4 is a plan view of the OLED illustrated in FIG. 1.

FIG. 5 is a cross-sectional view taken along the line II-II' of FIG. 4.

FIG. 6 is a cross-sectional view taken along the line III-III' of FIG. 4.

FIG. 7-8 are plan views of an OLED according to some embodiments.

FIG. 9-12 are cross-sectional views of an OLED according to some embodiments.

DETAILED DESCRIPTION OF CERTAIN INVENTIVE EMBODIMENTS

During the manufacturing process of OLED displays, the display substrate can be exposed to various accidental impacts. For example, an impact can be applied to the substrate while the substrate is being carried or various tests are being conducted thereon. The impact causes cracks in the substrate that tend to grow or propagate through an inorganic layer formed on the substrate. That is, a crack formed in a part of the non-display area can propagate to the display area along an inorganic insulating layer, thus reducing the reliability of the display area. To solve these problems, various technical attempts are being made to develop a substrate structured to be resistant to impact and suppress the propagation of cracks.

The aspects and features of the described technology and methods for achieving the aspects and features will be apparent by referring to the embodiments to be described in detail with reference to the accompanying drawings. However, the described technology is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the described technology, and the described technology is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the described technology, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element can be a second constituent element.

Hereinafter, embodiments of the described technology will be described with reference to the attached drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a plan view of an organic light-emitting diode (OLED) display 100 according to an embodiment. FIG. 2 is an enlarged view of a portion "A" of FIG. 1. FIG. 3 is a cross-sectional view taken along the line I-I' of FIG. 2.

Referring to FIGS. 1 through 3, the OLED display 100 includes a display area DA and a non-display area NDA located outside the display area DA.

The display area DA includes a plurality of gate lines 50 extending in a direction and a plurality of data lines 60 extending in a direction crossing the gate lines 50. In addition, a plurality of pixel areas can be defined by the gate lines 50 and the data lines 60. In each of the pixel areas defined by the gate lines 50 and the data lines 60, a thin-film transistor (TFT) connected to a gate line 50 and a data line 60 can be formed.

The layout of the display area DA will now be described in detail with reference to FIGS. 2 and 3.

A substrate 10 can be a plate-shaped member and can support other elements which will be described later. The substrate 10 can be an insulating substrate and can be formed of a polymer material including glass or plastic. In an exemplary embodiment, the substrate 10 is formed of polyimide (PI). However, the material of the substrate 10 is not limited thereto.

The substrate 10 can be a rigid substrate. However, the substrate 10 is not limited to the rigid substrate and can also be a ductile or flexible substrate. That is, the term "substrate" used herein can be understood as a flexible substrate that can be bent, folded, and rolled.

Referring to FIG. 3, the substrate 10 has a single layer structure. However, the structure of the substrate 10 is not limited to the single layer structure. That is, in some embodiments, the substrate 10 has a stacked structure of two or more layers. In other words, the substrate 10 can include a base layer and a passivation layer formed on the base layer.

The base layer can be formed of an insulating material. In an exemplary embodiment, the base layer can be formed of polyimide. However, the material of the base layer is not limited to polyimide. The passivation layer can be formed on the base layer. The passivation layer can be formed of an organic material or an inorganic material. For example, the passivation layer can be formed of one or more materials selected from polyethylene terephthalate (PET) and polyethylene naphthalate (PEN). However, the material of the passivation layer is not limited to the above examples.

A barrier layer 11 can be formed on the substrate 10. The barrier layer 11 can prevent penetration of impurity elements from the substrate 10. In some embodiments, the barrier layer 11 is formed of one or more materials selected from the group consisting of silicon oxide (SiOx) and silicon nitride (SiNx). However, the material of the barrier layer 11 is not limited to the above examples. The barrier layer 11 can have a single layer structure or a stacked structure of two or more layers. In an exemplary embodiment in which the barrier layer 11 includes two layers, the two layers can be formed of different materials. For example, a first layer can be formed of silicon oxide, and a second layer can be formed of silicon nitride. However, the structure of the barrier layer 11 is not limited to the above example. In some embodiments, the barrier layer 11 is omitted depending on the material or processing conditions of the substrate 10.

A buffer layer 12 can be formed on the barrier layer 11 so as to cover the barrier layer 11. The buffer layer 12 can be an inorganic layer formed of an inorganic material. In some embodiments, the buffer layer 12 is formed of one or more materials selected from the group consisting of SiOx, SiNx, aluminum oxide (AlOx), and silicon oxynitride (SiON). However, the material of the buffer layer 12 is not limited to the above examples. In addition, the buffer layer 12 can have a single layer structure or a stacked structure of two or more layers. In some embodiments in which the buffer layer 12 includes two layers, the two layers can be formed of different materials. For example, a first layer can be formed of silicon oxide, and a second layer can be formed of silicon nitride. However, the structure of the buffer layer 12 is not limited to the above example.

A semiconductor layer 40 can be formed of amorphous silicon or polycrystalline silicon. In some embodiments, the semiconductor layer 40 is formed by coating, patterning, and then crystallizing amorphous silicon. However, the method of forming the semiconductor layer 40 is not limited to the above example. The term "semiconductor layer" used herein can be understood as an oxide semiconductor layer.

A gate insulating layer 20 can be formed on the semiconductor layer 40. The gate insulating layer 20 can include SiNx or SiOx, but the material of the gate insulating layer 20 is not limited to the above examples. The gate insulating layer 20 can have a single layer structure. However, the structure of the gate insulating layer 20 is not limited to the single layer structure. The gate insulating layer 20 can also have a multilayer structure including two or more insulating layers with different physical properties.

A gate wiring including a gate line 50, a gate electrode 51 and a gate pad 55 can be formed on the gate insulating layer 20. The gate wiring can be formed of one or more materials selected from the group consisting of aluminum (Al)-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chrome (Cr), titanium (Ti), and tantalum (Ta). However, the material of the gate wiring is not limited to the above examples, and any transparent or semitransparent material having conductivity can be used to form the gate wiring.

The gate line 50 is provided in a plurality as described above, and the gate lines 50 extend substantially parallel to each other in a direction.

An interlayer insulating film 30 can be formed on the gate wiring to cover the gate wiring. The interlayer insulating film 30 can be an inorganic layer formed of an inorganic material. In some embodiments, the interlayer insulating film 30 includes SiNx or SiOx, but the material of the interlayer insulating film 30 is not limited to the above examples. The interlayer insulating film 30 can have a single layer structure. However, the structure of the interlayer insulating film 30 is not limited to the single layer structure. The interlayer insulating film 30 can also have a multilayer structure including two or more insulating layers with different physical properties. The interlayer insulating film 30 having the multilayer structure will be described later.

A data wiring including a source electrode 61, a drain electrode 62 and a data line 60 can be formed on the interlayer insulating film 30. The data wiring can be formed of molybdenum, chrome, refractory metal such as tantalum and titanium, or an alloy of these materials. However, the material of the data wiring is not limited to the above examples, and any transparent or semitransparent material having conductivity can be used to form the data wiring.

The data line 60 can deliver a data signal and cross the gate line 50. That is, in some embodiments, the gate line 50 can extend in a substantially horizontal direction, and the data line 60 can extend in a substantially vertical direction to cross the gate line 50.

In FIG. 2, the data line 60 and the gate line 50 are substantially linear. However, in some embodiments, each of the data line 60 and the gate line 50 also includes a bent portion. Because this is obvious to those of ordinary skill in the art, a detailed description thereof will be omitted.

The source electrode 61 can be a portion of the data line 60 and can lie in the same plane as the data line 60. The drain electrode 62 can be formed side by side with the source electrode 61. In this case, the drain electrode 62 can be formed side by side with the portion of the data line 60.

The gate electrode 51, the source electrode 61, the semiconductor layer 40, and the drain electrode 62 form one TFT. A channel of the TFT can be formed in the semiconductor layer 40 between the source electrode 61 and the drain electrode 62.

A planarization layer 70 can be formed on the data wiring to at least partially cover the data wiring and the interlayer insulating film 30. The planarization layer 70 can be relatively thicker than the interlayer insulating film 30. Due to this difference between the thicknesses of the planarization layer 70 and the interlayer insulating film 30, a top surface of the planarization layer 70 can be relatively flatter than a bottom surface thereof which contacts the interlayer insulating film 30 and the source and drain electrodes 61 and 62. In order to reduce steps of manufacturing the OLED display 100, the planarization layer 70 can include one or more materials selected from the group consisting of, e.g., acrylic, benzocyclicbutene (BCB), and polyimide. However, the material of the planarization layer 70 is not limited to the above examples. The planarization layer 70 can also be formed of a photosensitive material.

A first contact hole 71 which at least partially exposes the drain electrode 62 can be formed in the planarization layer 70. Specifically, the first contact hole 71 can penetrate through the planarization layer 70 and partially expose a top surface of the drain electrode 62.

A first electrode 80 can be formed on the planarization layer 70 and an exposed portion of the drain electrode 62. That is, the first electrode 80 can at least partially cover the planarization layer 70, sidewalls of the first contact hole 71, and the top surface of the drain electrode 62. Accordingly, the first electrode 80 and the drain electrode 62 can be electrically connected to each other. In some embodiments, the first electrode 80 is an anode, but is not limited thereto. The first electrode 80 can be formed of indium tin oxide (ITO) or indium zinc oxide (IZO). However, the material of the first electrode 80 is not limited to the above examples. A pixel defining layer 90 can be formed on the first electrode 80. The pixel defining layer 90 can expose at least part of the first electrode 80. The pixel defining layer 90 can be formed of one or more organic materials selected from benzocyclobutene (BCB), polyimide (PI), polyamide (PA), acrylic resin, and phenolic resin. Alternatively, the pixel defining layer 90 can be formed of an inorganic material such as silicon nitride. The pixel defining layer 90 can also be formed of a photosensitizer including black pigments. In this case, the pixel defining layer 90 serves as a light-blocking member.

An organic layer 91 can be formed on a portion of the first electrode 80 exposed by the pixel defining layer 90. The organic layer 91 can include organic material layers included in the OLED display 100, that is, an organic light-emitting layer (EML), a hole injection layer (HIL), a hole transport layer (HTL), an electron injection layer (EIL), and an electron transport layer (ETL). The organic layer 91 can have a single layer structure including one of the organic material layers or a multilayer structure including two or more of the organic material layers.

A second electrode 92 can be formed on the organic layer 91. The second electrode 92 can cover the pixel defining layer 90 and the organic layer 91. In some embodiments, the second electrode 92 is a whole-surface electrode which substantially covers the pixel defining layer 90 and the organic layer 91, but is not limited thereto. In some embodiments, the second electrode 92 is a cathode.

The second electrode 92 can be formed of ITO or IZO, but the material of the second electrode 92 is not limited to the above examples.

An encapsulation layer 800 can be formed on the second electrode 92. The encapsulation layer 800 can cover the display area DA and the non-display area NDA. Specifically, the encapsulation layer 800 can cover the entire display area DA and at least part of the non-display area NDA. In some embodiments, the encapsulation layer 800 does not cover the non-display area NDA. Accordingly, some elements (e.g., the substrate 10, wiring patterns, etc.) formed in the non-display area NDA can be partially exposed.

The encapsulation layer 800 can be formed of an organic material and/or an inorganic material.

The organic material used to form the encapsulation layer 800 can be, but is not limited to, epoxy, acrylate, or urethane acrylate. The inorganic material used to form the encapsulation layer 800 can be, but is not limited to, aluminum oxide or silicon oxide.

The encapsulation layer 800 can have a single layer structure. However, the structure of the encapsulation layer 800 is not limited to the single layer structure, and the encapsulation layer 800 can also have a stacked structure of one or more layers. In some embodiments, the encapsulation layer 800 is formed by alternately stacking an organic layer and an inorganic layer at least once. However, this is merely an example, and the structure of the encapsulation layer 800 is not limited to the above example.

The non-display area NDA of the OLED display 100 according to the current embodiment will now be described.

Referring back to FIG. 1, a scan driver 200, an emission driver 300, and a plurality of wiring patterns connected to the scan driver 200, the emission driver or the display area DA can be formed in the non-display area NDA. Each of the wiring patterns can include a wiring line 401 which extends from the scan driver 200, the emission driver 300 or the display area DA and a wiring pad 402 which is formed at an end of the wiring line 401 and has an end wider than the wiring line 401.

An OLED display 100 according to various embodiments will now be described in more detail with reference to FIGS. 4 through 6.

FIG. 4 is a plan view of the OLED display 100 illustrated in FIG. 1. FIG. 5 is a cross-sectional view taken along the line II-II' of FIG. 4. FIG. 6 is a cross-sectional view taken along the line III-III' of FIG. 4.

Referring to FIGS. 4 through 6, the OLED display 100 according to the current embodiment includes the display area DA and the non-display area NDA. The non-display area NDA includes the substrate 10, an inorganic layer 700 which is formed on the substrate 10, the encapsulation layer 800 which is formed on the inorganic layer 700, and recess patterns or openings 501 which are recessed from a top surface of the encapsulation layer 800 by a predetermined distance and penetrate through the encapsulation layer 800 and at least part of the inorganic layer 700.

Because the display area DA and the non-display area NDA have been described above, a detailed description thereof will be omitted.

As described above, the inorganic layer 700 can be formed on the substrate 10. The inorganic layer 700 can be formed over the entire display area DA and the entire non-display area NDA, but the described technology is not limited thereto.

The inorganic layer 700 formed in the non-display area NDA can correspond to an inorganic layer formed in the display area DA. That is, the inorganic layer 700 formed in the non-display area NDA can be formed of substantially the same material as the buffer layer 11 and/or the barrier layer 12 formed in the display area DA and can be formed at substantially the same time as the buffer layer 11 and/or the barrier layer 12. However, this is merely an example, and the method of forming the inorganic layer 700 in the non-display area NDA is not limited to the above example.

Various elements including the first electrode 80, the organic layer 91, and the second electrode 92 can be formed on the inorganic layer 700 located in the display area DA. Because this has been described above in detail, a detailed description thereof will be omitted.

The encapsulation layer 800 can be formed on the inorganic layer 700 located in the non-display area NDA. That is, at least part of the inorganic layer 700 formed in the non-display area NDA can directly contact the encapsulation layer 800. The encapsulation layer 800 can cover the whole of the display area DA and at least part of the non-display area NDA as described above.

In some embodiments, the encapsulation layer 800 can cover at least part of the non-display area NDA. If the encapsulation layer 800 covers at least part of the non-display area NDA, the substrate 10, the inorganic layer 700 formed on the substrate 10, and other elements formed in the non-display area NDA can be partially exposed along edges of the encapsulation layer 800.

The recess patterns 501 can be formed in an area where the encapsulation layer 800 and the inorganic layer 700 at least partially overlap each other.

In some embodiments, the recess patterns 501 can be formed adjacent to edges of the display area DA and arranged along the edges of the display area DA. However, the arrangement of the recess patterns 501 is not limited to this example. That is, in FIG. 4, a plurality of recess patterns 501 are arranged in a row along the edges of the display area DA. However, this is merely an example, and the arrangement of the recess patterns 501 is not limited to the above example. In some embodiments, the recess patterns 501 can be arranged in one or more rows or can be scattered irregularly.

In addition, in some embodiments in which the scan driver 200, the emission driver 300 and the wiring patterns are formed in the non-display area NDA, the recess patterns 501 are placed to not overlap the above elements, or some of the recess patterns 501 are omitted. For example, each recess pattern 501 can be formed between one wiring pattern and another wiring pattern adjacent to the wiring pattern.

In some embodiments, each of the recess patterns 501 has a quadrilateral planar shape. However, this is merely an example, and the planar shape of each of the recess patterns 501 is not limited to the above example. In some embodiments, the planar shape of each of the recess patterns 501 can be a polygonal shape or a shape at least partially including a curve.

Referring to a cross-sectional shape of each of the recess patterns 501 as illustrated in FIG. 6, the recess patterns 501 are recessed downward from the top surface of the encapsulation layer 800 by a predetermined distance.

The recess patterns 501 can completely penetrate through the encapsulation layer 800. In addition, the recess patterns 501 can penetrate at least part of the inorganic layer 700. Accordingly, the recess patterns 501 can expose the substrate 10 or partially expose the inorganic layer 700.

In other words, a bottom surface of each of the recess patterns 501 can include a top surface of the substrate 10 or a top surface of the inorganic layer 700, and sidewalls of each of the recess patterns 501 can include inner sidewalls of the encapsulation layer 800 and inner sidewalls of the inorganic layer 700.

The recess patterns 501 can suppress the formation of cracks in a subsequent process or by impact on a finished product or prevent the propagation and growth of cracks formed. Typically, cracks of the OLED display 100 tend to propagate along a layer formed of an inorganic material. However, if the recess patterns 501 are formed in the area where the encapsulation layer 800 and the inorganic layer 700 overlap each other, the formation of cracks can be suppressed, or the propagation of cracks along a layer formed of an inorganic material can be blocked.

Hereinafter, other embodiments will be described. In the following embodiments, elements identical to those described above are indicated by like reference numerals, and a redundant description thereof will be omitted or given briefly.

FIG. 7 is a plan view of an OLED display 120 according to another embodiment.

Referring to FIG. 7, the OLED display 120 according to the current embodiment is different from the OLED display 100 of FIG. 4 in that it includes line-type recess patterns 502 extending along a lengthwise direction.

In some embodiments, the recess patterns 502 can be line-type recess patterns extending along the lengthwise direction. In other words, the recess patterns 502 can be shaped like bars extending along the lengthwise direction.

In some embodiments in which a display area DA is quadrilateral, each of the recess patterns 502 can be formed substantially parallel to a side of the display area DA.

In FIG. 7, each recess pattern 502 is separated from another recess pattern 502 adjacent to the recess pattern 502. However, this is merely an example, and the described technology is not limited to this example. Each recess pattern 502 can also be connected to another recess pattern 502 adjacent to the recess pattern 502.

In FIG. 7, three recess patterns 502_1 through 502_3 are placed to correspond to edges of the display area DA. However, the number of recess patterns 502 is not limited to three, and at least any one of the recess patterns 502_1 through 502_3 can be omitted. For example, if wiring patterns are placed adjacent to a side of the display area DA, a recess pattern corresponding to the side can be omitted. That is, if the wiring patterns are placed adjacent to a lower side of the display area DA, a recess pattern corresponding to the side can be omitted as illustrated in FIG. 7.

FIG. 8 is a plan view of an OLED display 130 according to another embodiment.

Referring to FIG. 8, the OLED display 130 according to the current embodiment is different from the OLED display 100 of FIG. 4 in that it includes dot-type recess patterns 503.

The recess patterns 503 can be of a dot type. That is, each of the recess patterns 503 can have a circular planar shape.

In some embodiments, the recess patterns 503 can be formed adjacent to edges of a display area DA and arranged along the edges of the display area DA. However, the arrangement of the recess patterns 503 is not limited to this example. That is, in FIG. 8, a plurality of recess patterns 503 are arranged in a row along the edges of the display area DA. However, this is merely an example, and the arrangement of the recess patterns 503 is not limited to the above example. In embodiments, the recess patterns 503 can be arranged in one or more rows or can be scattered irregularly.

In addition, in some embodiments in which a scan driver 200, an emission driver 300 and wiring patterns are formed in a non-display area NDA, the recess patterns 503 can be placed to not overlap the above elements, or some of the recess patterns 503 can be omitted. For example, each recess pattern 503 can be formed between one wiring pattern and another wiring pattern adjacent to the wiring pattern.

FIG. 9 is a cross-sectional view of an OLED display 140 according to another embodiment.

Referring to FIG. 9, the OLED display 140 according to the current embodiment is different from the OLED display 100 of FIGS. 4-6 in that an encapsulation layer 801 includes a first sub-encapsulation layer 801_1 and a second sub-encapsulation layer 801_2 formed on the first sub-encapsulation layer 801_1. The OLED display 140 is different from the OLED display 100 also in that an inorganic layer 701 includes a first sub-inorganic layer 701_1 and a second sub-inorganic layer 701_2 formed on the first sub-inorganic layer 701_1.

As described above, each of the encapsulation layer 801 and the inorganic layer 701 can have a stacked structure of one or more layers.

In some embodiments, the first and second encapsulation layers 801_1 and 801_2 are formed of an inorganic material. For example, the first and second sub-encapsulation layers 801_1 and 801_2 can be formed of one or more materials selected from the group consisting of SiOx, SiNx, AlOx, and SiON. However, the first and second sub-encapsulation layers 801_1 and 801_2 can have different compositions or can be formed of different materials.

In some embodiments, the first sub-inorganic layer 701_1 can be formed on a substrate 10, and the second sub-inorganic layer 701_2 can be formed on the first sub-inorganic layer 701_1. The first and second sub-inorganic layers 701_1 and 701_2 can be formed of an inorganic material. For example, the first sub-inorganic layer 701_1 and the second sub-inorganic layer 701_2 can be formed of one or more materials selected from the group consisting of SiOx, SiNx, AlOx, and SiON. However, the first and second sub-inorganic layers 701_1 and 701_2 can have different compositions or can be formed of different materials.

In some embodiments, the first and second sub-inorganic layers 701_1 and 701_2 of a non-display area NDA can respectively correspond to a buffer layer 11 and a barrier layer 12 of a display area DA. That is, the first sub-inorganic layer 701_1 can be formed of the same material as the buffer layer 11, and the second sub-inorganic layer 701_2 can be formed of the same material as the barrier layer 12. In other words, the first and second sub-inorganic layers 701_1 and 701_2 can be formed at substantially the same time as the buffer layer 11 and the barrier layer 12. However, this is merely an example, the process of forming the first and second sub-inorganic layers 701_1 and 701_2 is not limited to this example.

Recess patterns 504 can be recessed downward from a top surface of the encapsulation layer 801.

The recess patterns 504 can completely penetrate through the encapsulation layer 801. In addition, the recess patterns 504 can penetrate through at least part of the inorganic layer 701. In some embodiments, the recess patterns 504 can completely penetrate through the first and second sub-encapsulation layers 801_1 and 801_2 and at least partially penetrate through the second sub-inorganic layer 701_2.

Accordingly, a bottom surface of each of the recess patterns 504 can include the first sub-inorganic layer 701_1. Sidewalls of each of the recess patterns 504 can include inner sidewalls of each of the first sub-encapsulation layer 801_1, the second sub-encapsulation layer 801_2, and the second sub-inorganic layer 701_2.

FIG. 10 is a cross-sectional view of an OLED display 150 according to another embodiment.

Referring to FIG. 10, recess patterns 505 of the OLED display 150 according to the current embodiment is different from the OLED display 140 of FIG. 9 in that it can further penetrate through a first sub-inorganic layer 701_1, thereby exposing a substrate 10.

The recess patterns 505 can be recessed downward from a top surface of an encapsulation layer 801 by a predetermined distance.

The recess patterns 505 can completely penetrate through the encapsulation layer 801. In addition, the recess patterns 505 can completely penetrate through an inorganic layer 701. In some embodiments, the recess patterns 505 can completely penetrate through each of a first sub-encapsulation layer 801_1, a second sub-encapsulation layer 801_2, the first sub-inorganic layer 701_1, and a second sub-inorganic layer 701_2. That is, the recess patterns 505 can partially expose a top surface of the substrate 10.

Accordingly, a bottom surface of each of the recess patterns 505 can include part of the top surface of the substrate 10, and sidewalls of each of the recess patterns 505 can include inner sidewalls of the first sub-encapsulation layer 801_1, inner sidewalls of the second sub-encapsulation layer 801_2, inner sidewalls of the first sub-inorganic layer 701_1, and inner sidewalls of the second sub-inorganic layer 701_2.

FIG. 11 is a cross-sectional view of an OLED display 160 according to another embodiment.

Referring to FIG. 11, the OLED display 160 according to the current embodiment is different from the OLED display 140 according to the embodiment of FIG. 9 in that an encapsulation layer 802 includes an organic encapsulation layer 802_3 between first and second sub-encapsulation layers 802_1 and 802_2.

In some embodiments, the encapsulation layer 802 can include the organic encapsulation layer 802_3. The organic encapsulation layer 802_3 can be interposed between the first and second sub-encapsulation layers 802_1 and 802_2.

The first and second sub-encapsulation layers 802_1 and 802_2 can be substantially identical to those described above with reference to FIG. 9, and thus a detailed description thereof will be omitted.

The organic encapsulation layer 802_3 can be formed of an organic material. For example, the organic encapsulation layer 802_3 can be formed of one or more materials selected from the group consisting of parylene(poly-p-xylylene) (PPX), poly-2-chloro-p-zylylene (PCPX), poly[2-methoxy-r-(2'ethyhexylloxy)-1,4-phenylenevinylene], polyurea, and polyamic acid. However, the material of the organic encapsulation layer 802_3 is not limited to the above examples. The organic encapsulation layer 802_3 can be formed by applying a liquid material or by sputtering, thermal deposition, chemical vapor deposition (CVD), plasma enhanced chemical vapor deposition (PECVD), ion beam assisted deposition (IBAD), atomic layer deposition (ALD), etc. However, the method of forming the organic encapsulation layer 802_3 is not limited to the above examples.

Recess patterns 506 can be recessed downward from a top surface of the encapsulation layer 802 by a predetermined distance.

The recess patterns 506 can completely penetrate through the encapsulation layer 802. In addition, the recess patterns 506 can penetrate through at least part of an inorganic layer 701. In some embodiments, the recess patterns 506 can completely penetrate through each of the first sub-encapsulation layer 802_1, the second sub-encapsulation layer 802_2, and the organic encapsulation layer 802_3 and at least partially penetrate through a second sub-inorganic layer 701_2.

Accordingly, a bottom surface of each of the recess patterns 506 can include a first sub-inorganic layer 701_1, and sidewalls of each of the recess patterns 506 can include inner sidewalls of the first sub-encapsulation layer 802_1, inner sidewalls of the second sub-encapsulation layer 802_2, inner sidewalls of the organic encapsulation layer 802_3, and inner sidewalls of the second sub-inorganic layer 701_2.

FIG. 12 is a cross-sectional view of an OLED display 170 according to another embodiment.

Referring to FIG. 12, recess patterns 507 of the OLED display 170 according to the current embodiment can further penetrate through a first sub-inorganic layer 701_1, thereby exposing a substrate 10.

The recess patterns 507 can be recessed downward from a top surface of an encapsulation layer 802 by a predetermined distance.

The recess patterns 507 can completely penetrate through the encapsulation layer 802. In addition, the recess patterns 507 can completely penetrate through an inorganic layer 701. In some embodiments, the recess patterns 507 can completely penetrate through each of a first sub-encapsulation layer 802_1, a second sub-encapsulation layer 802_2, an organic encapsulation layer 802_3, the first sub-inorganic layer 701_1, and a second sub-inorganic layer 701_2. That is, the recess patterns 507 can partially expose a top surface of the substrate 10.

Accordingly, a bottom surface of each of the recess patterns 507 can include part of the top surface of the substrate 10, and sidewalls of each of the recess patterns 507 can include inner sidewalls of the first sub-encapsulation layer 802_1, inner sidewalls of the second sub-encapsulation layer 802_2, inner sidewalls of the first sub-inorganic layer 701_1, and inner sidewalls of the second sub-inorganic layer 701_2.

A method of manufacturing an OLED display according to an embodiment will now be described. For ease of description, elements identical to those described above are indicated by like reference numerals.

The method of manufacturing the OLED display includes preparing a substrate in which a display area and a non-display area are defined and an inorganic layer is formed. The method further includes forming an encapsulation layer on the substrate to cover the whole of the display area and at least part of the non-display area. The method additionally includes recess patterns to penetrate the whole of the encapsulation layer and at least part of the inorganic layer by recessing an area where the encapsulation layer and the inorganic layer overlap each other.

For example, a substrate 10 in which a display area DA and a non-display area NDA are defined and an inorganic layer 700 is formed is prepared.

Next, an encapsulation layer 800 can be formed on the substrate 10 to cover the whole of the display area DA and at least part of the non-display area NDA.

Recess patterns can be formed to penetrate the whole of the encapsulation layer 800 and at least part of the inorganic layer 700 by recessing the area where the encapsulation layer 800 and the inorganic layer 700 overlap each other. As described above, the encapsulation layer 800 can overlap the inorganic layer 700 formed in the non-display area NDA. That is, the encapsulation layer 800 can directly contact part of the inorganic layer 700.

The method of forming the recess patterns by recessing the encapsulation layer 800 and the inorganic layer 700 is not limited to a particular method. For example, the recess patterns can be formed using, but not limited to, a mechanical method, wet etching, or dry etching.

The recess patterns can be substantially identical to those included in the OLEDs according to the above-described embodiments.

Embodiments of the described technology provide at least one of the following advantages.

That is, it is possible to prevent the formation of cracks in an OLED display by external impact.

In addition, it is possible to prevent the growth or propagation of cracks formed by external impact.

However, the effects of the described technology are not restricted to the one set forth herein. The above and other effects of the described technology will become more apparent to one of ordinary skill in the art to which the described technology pertains by referencing the claims.

While the inventive technology has been particularly shown and described with reference to exemplary embodiments thereof, it will be understood by those of ordinary skill in the art that various changes in form and detail can be made therein without departing from the spirit and scope of the present invention as defined by the following claims. The exemplary embodiments should be considered in a descriptive sense only and not for purposes of limitation.

What is claimed is:

1. An organic light-emitting diode (OLED) display, comprising:
    a substrate having a display area and a non-display area surrounding the display area;
    an inorganic layer formed over the substrate, wherein a portion of the inorganic layer is formed over the non-display area; and
    an encapsulation layer formed over the inorganic layer, wherein a portion of the encapsulation layer is formed over the non-display area,
    wherein a plurality of openings are formed in and through the portion of the encapsulation layer and the portion of the inorganic layer, wherein each opening has opposing sides,
    wherein sidewalls of the inorganic layer and sidewalls of the encapsulation layer are aligned with each other, and wherein the opposing sides of each opening are defined by the sidewalls of the inorganic layer and the encapsulation layer,
    wherein the plurality of openings are arranged discontinuously along the edges of the display area, and wherein each of the openings has a closed shape on a plan view, and wherein a top surface of the substrate is exposed by the openings formed in and through the encapsulation layer and the inorganic layer.

2. The OLED display of claim 1, further comprising: a first electrode formed over the display area; an organic layer formed over the first electrode; and a second electrode formed over the organic layer, wherein the encapsulation layer is further formed over the display area.

3. The OLED display of claim 1, wherein the openings are formed adjacent to edges of the display area and arranged along the edges of the display area.

4. The OLED display of claim 1, wherein each of the openings is substantially rectangular.

5. The OLED display of claim 1, wherein each of the openings is substantially circular.

6. The OLED display of claim 1, wherein the encapsulation layer comprises: a first sub-encapsulation layer formed over the inorganic layer; and a second sub-encapsulation layer formed over the first sub-encapsulation layer, wherein the first and second sub-encapsulation layers are formed of different materials.

7. The OLED display of claim 6, wherein the inorganic layer comprises: a first sub-inorganic layer formed over the substrate; and a second sub-inorganic layer formed over the first sub-inorganic layer, wherein the first and second sub-inorganic layers are formed of different materials.

8. The OLED display of claim 7, wherein the openings are further formed through the first sub-encapsulation layer, the second sub-encapsulation layer, and the second sub-inorganic layer so as to expose a portion of the first sub-inorganic layer.

9. The OLED display of claim 7, wherein the openings are further formed through the first and second sub-encapsulation layers and the first and second sub-inorganic layers so as to expose the substrate.

10. The OLED display of claim 7, further comprising an organic encapsulation layer interposed between the first and second sub-encapsulation layers.

11. The OLED display of claim 10, wherein the openings are further formed through the first sub-encapsulation layer, the organic encapsulation layer, the second sub-encapsulation layer, and the second sub-inorganic layer so as to expose a portion of the first sub-inorganic layer.

12. The OLED display of claim 10, wherein the openings are further formed through the first and second sub-encapsulation layers, the organic encapsulation layer, and the first and second sub-inorganic layers so as to expose the substrate.

13. The OLED display of claim 1, the inorganic layer includes a first portion formed in the display area and a second portion formed over the non-display area, wherein the second portion of the inorganic layer is separated from, and is smaller than, the first portion of the inorganic layer.

14. The OLED display of claim 13, wherein the encapsulation layer includes a first portion formed in the display area and a second portion formed in the non-display area, and wherein the second portion of the encapsulation layer is separated from, and is smaller than, the first portion of the encapsulation layer.

15. The OLED display of claim 14, wherein the first and second portions of the inorganic layer surround a lower portion of each of the openings.

16. The OLED display of claim 15, wherein the first and second portions of the encapsulation layer surround an upper portion of each of the openings.

17. The OLED display of claim 1, wherein the plurality of openings are spaced apart from one another and surround the display area.

* * * * *